United States Patent
Hiramoto

[11] Patent Number: 5,909,158
[45] Date of Patent: Jun. 1, 1999

[54] SURFACE ACOUSTIC WAVE RESONATOR FILTER WITH LONGITUDINALLY COUPLED RESONATORS HAVING SPECIFIC RESONANCE FREQUENCY PLACEMENTS

[75] Inventor: Masahiro Hiramoto, Kaga, Japan

[73] Assignee: Murata Manufacturing Co., Ltd., Kyoto-fu, Japan

[21] Appl. No.: 08/917,981

[22] Filed: Aug. 27, 1997

[30] Foreign Application Priority Data

Aug. 28, 1996 [JP] Japan .................................. 8-227027

[51] Int. Cl.$^6$ ...................................................... H03H 9/64
[52] U.S. Cl. ...................................... 333/195; 310/313 D
[58] Field of Search .................................. 333/193–196; 310/313 R, 313 B, 313 C, 313 D

[56] References Cited

U.S. PATENT DOCUMENTS

| 5,559,483 | 9/1996 | Kajihara et al. | 333/194 X |
| 5,592,040 | 1/1997 | Yamamoto | 310/313 D |
| 5,646,584 | 7/1997 | Kondratyev et al. | 333/193 |
| 5,666,092 | 9/1997 | Yamamoto et al. | 333/194 |

FOREIGN PATENT DOCUMENTS

| 0584761 A1 | 3/1994 | European Pat. Off. | 333/193 |
| 7-58585 | 3/1995 | Japan | 333/194 |
| 8-204502 | 8/1996 | Japan | 333/193 |
| 6420493 | of 1975 | Taiwan . | |
| 77210636 | of 1989 | Taiwan . | |

*Primary Examiner*—Robert Pascal
*Assistant Examiner*—Barbara Summons
*Attorney, Agent, or Firm*—Graham & James LLP

[57] ABSTRACT

A surface acoustic wave resonator filter has a wide bandwidth, a low insertion loss characteristic and a sharp attenuation characteristic at edges of the passband. The surface acoustic wave resonator filter includes first and second longitudinally coupled resonator filters disposed on a piezoelectric substrate. The first and second longitudinally coupled resonator filters each have first, second, and third resonance modes. The phases of the output signals of the first and second longitudinally coupled resonator filters are opposite to each other for an input signal at frequencies higher than the passband. The difference in frequency between the first resonance mode of the first longitudinally coupled resonator filter and the first resonance mode of the second longitudinally coupled resonator filter is smaller than the difference in frequency between the first resonance mode and any other resonance modes in the first and second longitudinally coupled resonator filters. The difference in frequency between the third resonance mode of the first longitudinally coupled resonator filter and the third resonance mode of the second longitudinally coupled resonator filter is smaller than the difference in frequency between the third resonance mode and any other resonance modes in the first and second longitudinally coupled resonator filters.

11 Claims, 5 Drawing Sheets

SURFACE ACOUSTIC WAVE RESONATOR FILTER WITH LONGITUDINALLY COUPLED RESONATORS HAVING SPECIFIC RESONANCE FREQUENCY PLACEMENTS

BACKGROUND OF THE INVENTION

1. Field of the Invention

The present invention relates to a bandpass filter using a surface acoustic wave resonator, and more particularly, to a surface acoustic wave resonator filter including a plurality of longitudinally coupled surface acoustic wave resonator filters which are connected in parallel.

2. Description of the Related Art

Surface acoustic wave resonator filters are now widely used as bandpass filters in mobile communication devices. In recent years, digital signal transmission techniques have become popular in mobile communication systems. However, unlike analog mobile communication systems, it is strongly required that the filters used in the digital mobile communication systems have not only high temperature stability and a sharp cutoff characteristic at band edges but also a wide bandwidth and a flat group delay time characteristic over the entire passband. In particular, these requirements are critical for an intermediate frequency (IF) filter.

Unlike the analog mobile communication systems in which surface acoustic wave filters consisting of transversely coupled surface acoustic wave resonator filters are usually used, transversal surface acoustic wave filters or longitudinally coupled surface acoustic wave resonator filters are used in the digital mobile communication systems in order to meet the above requirements.

Although transversal surface acoustic wave filters have the advantage that a wide bandwidth and a flat group delay time characteristic can be easily achieved, they have the disadvantage that they have a large insertion loss and it is difficult to produce such filters to have a relatively small size.

On the other hand, the longitudinally coupled surface acoustic wave resonator filter has a lower insertion loss than the transversal surface acoustic wave filter and can have a wider bandwidth than the transversely coupled surface acoustic wave resonator filter. However, the disadvantage of the longitudinally coupled surface acoustic wave resonator filter is that the attenuation at the higher edge of the passband is not sharp, as shown in FIG. 5. In FIG. 5, the solid line A represents the same characteristic as the solid line B but the attenuation is expressed in an expanded scale denoted on the right of the vertical axis.

To avoid the above problem, it has been proposed to connect in parallel a plurality of longitudinally coupled resonator filters having different passbands thereby realizing a surface acoustic wave resonator filter having a wide bandwidth and having an improved attenuation characteristic at the higher edge of the passband as shown in FIG. 6 (refer to, for example, Japanese Patent Laid-Open No. 6-334476). In this specific example, a lower-frequency longitudinally coupled surface acoustic wave resonator filter having a relatively wide bandwidth is connected in parallel to a higher-frequency longitudinally coupled surface acoustic wave resonator filter having a relatively narrow bandwidth.

However, as described in Japanese Patent Laid-Open No. 6-334476, the attenuation characteristic at the higher band edge of this surface acoustic wave resonator filter is realized merely by the attenuation characteristic of the higher-frequency, narrow-bandwidth longitudinally coupled surface acoustic wave resonator filter, and thus the attenuation characteristic at the higher edge of the passband is not sufficient.

Furthermore, in the technique disclosed in Japanese Patent Laid-Open No. 334476, the resonance mode of each longitudinally coupled surface acoustic wave resonator filter is set in such a manner that the resonance modes of higher-frequency and lower-frequency longitudinally coupled surface acoustic wave resonator filters overlap with each other so that the output signals of these two longitudinally coupled surface acoustic wave resonator filters are always equal in phase thereby defining the overall filter characteristic.

However, in such a surface acoustic wave resonator filter, an inversion in phase occurs at the resonance frequency of each resonance mode. Therefore, if there is a deviation in frequency between the lower-frequency surface acoustic wave resonator filter and the higher-frequency surface acoustic wave resonator filter, a frequency range appears where the output signals of the two surface acoustic wave resonator filters become nearly equal in level but opposite in phase. This means that a slight error in production processing such as a variation in the thickness or a width of an electrode film can cause such a deviation in frequency which produces a range where the output signals become equal in level but opposite in phase. The emergence of such a range can cause a group delay ripple C near the center of the passband, as shown in FIG. 7. Such a group delay ripple C causes great degradation in the characteristics of the IF filter used in the digital communication device.

SUMMARY OF THE INVENTION

The preferred embodiments of the present invention overcome the problems discussed above by providing a surface acoustic wave resonator filter having a low insertion loss, a wide band width and a significantly increased attenuation characteristic at edges of the passband while eliminating a group delay ripple in the passband.

According to preferred embodiments of the present invention, there is provided a surface acoustic wave resonator filter including first and second longitudinally coupled resonator filters connected in parallel to each other, each longitudinally coupled resonator filter including: a piezoelectric substrate; a plurality of interdigital transducers disposed on the piezoelectric substrate; and a pair of reflectors disposed at opposite ends of each of the interdigital transducers; wherein the first and second longitudinally coupled resonator filters each have first, second, and third resonance modes such that a resonance frequency of each mode increases in order of first, second, and third resonance modes;

the first and second longitudinally coupled resonator filters are connected in such a manner that the output signals of the first and second longitudinally coupled resonator filters are opposite in phase to each other for an input signal at frequencies higher than a passband of the filter;

the first resonance mode of the first longitudinally coupled resonator filter and the first resonance mode of the second longitudinally coupled resonator filter are close enough to each other so that a difference in resonance frequency between the first resonance mode of the first longitudinally coupled resonator filter and the first resonance mode of the second longitudinally coupled resonator filter is smaller than differences in resonance frequency between the first resonance mode and any other resonance modes for the first and second longitudinally coupled resonator filters; and the third resonance mode of the first longitudinally coupled resonator filter and the third resonance mode of the second longitudinally coupled resonator filter are close enough to each other so that a difference in resonance frequency between the third resonance mode of the first longitudinally coupled resonator filter and the third resonance mode of the second longitudinally coupled resonator filter is smaller than differences in resonance frequency between the third resonance mode and any other resonance modes for the first and second longitudinally coupled resonator filter.

Preferably, the third resonance mode of the second longitudinally coupled resonator filter has a steeper characteristic than the third resonance mode of the first longitudinally coupled resonator filter, and the third resonance mode of the second longitudinally coupled resonator filter is located at a higher frequency than the third resonance mode of the first longitudinally coupled resonator filter.

Furthermore, a difference in resonance frequency between the second and third resonance modes of the second longitudinally coupled resonator filter is preferably smaller than a difference in resonance frequency between the second and third resonance modes of the first longitudinally coupled resonator filter.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
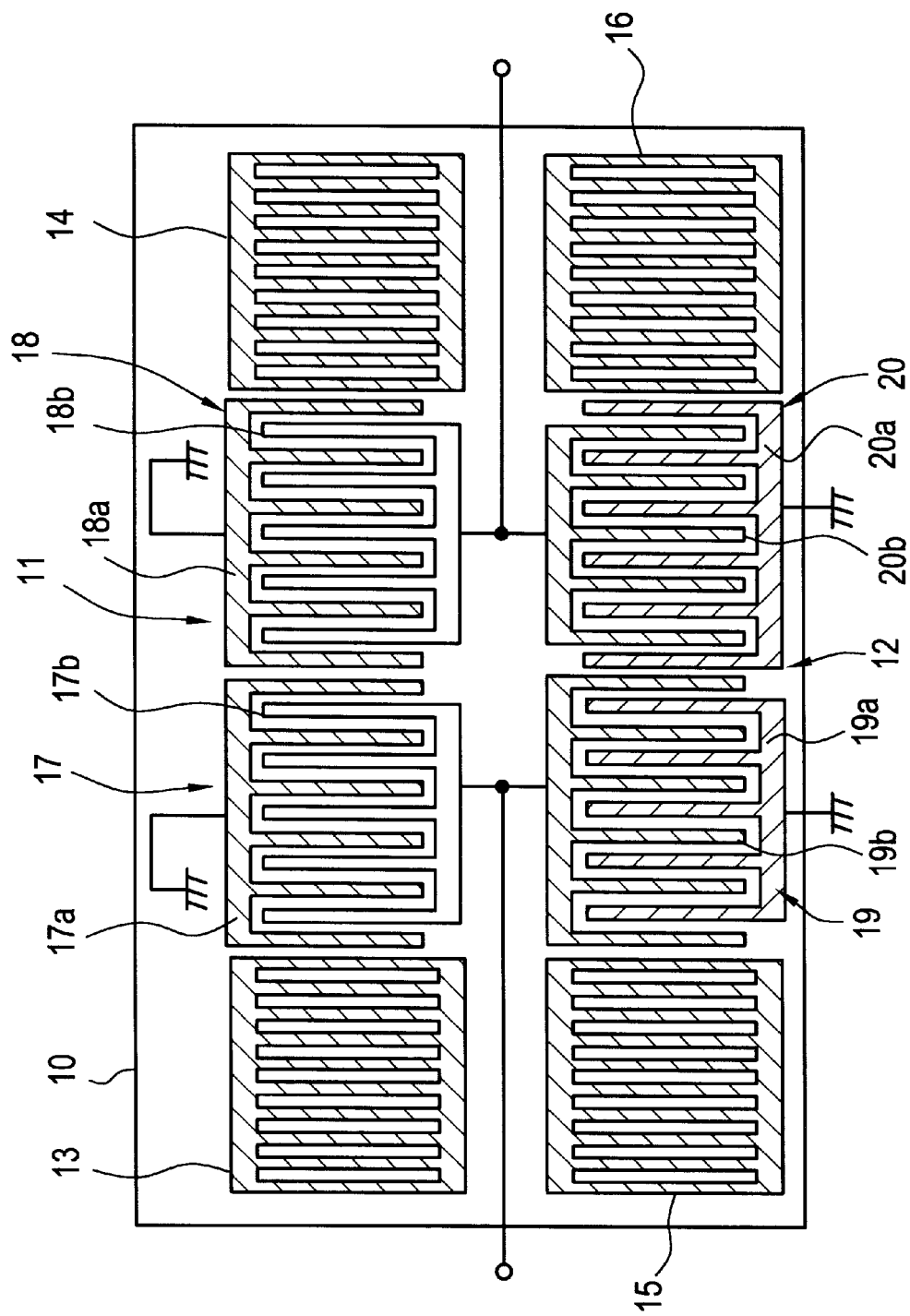
FIG. 1 is a plan view schematically illustrating a preferred embodiment of a surface acoustic wave resonator filter according to the present invention.

Referring to the accompanying drawings, the surface acoustic wave resonator filter according to preferred embodiments of the present invention will be described in further detail below. FIG. 1 is a simplified plan view illustrating a preferred embodiment of a surface acoustic resonator according to the present invention.

First and second longitudinally coupled resonator filters 11 and 12 are disposed on a piezoelectric substrate 10 (represented by a phantom line). The piezoelectric substrate 10 may be made up of a piezoelectric ceramic material such as a lead zirconate titanate-based piezoelectric ceramic material or a piezoelectric single-crystal material such as quartz, $LiTaO_3$, or $LiNbO_3$.

The piezoelectric substrate 10 may also be realized by forming a piezoelectric thin film such as ZnO on an insulating substrate made up of an insulating material such as aluminum oxide. In the case where the piezoelectric substrate 10 is realized by providing a piezoelectric thin film on an insulating substrate, electrodes which will be described later may be disposed on either the upper surface or the lower surface of the piezoelectric thin film.

The first longitudinally coupled resonator filter 11 includes an input interdigital transducer (hereinafter referred to as an IDT) 17 and an output IDT 18 disposed to extend along a surface wave propagation direction. The IDTs 17 and 18 each have a plurality of electrode fingers meshing with each other in an interdigital fashion. That is, the IDT 17 has comb electrodes 17a and 17b each including one or more electrode fingers, wherein the comb electrode 17a and the comb electrode 17b are disposed in such a manner that their electrode fingers mesh with each other in an interdigital fashion. The IDT 18 also has similar comb electrodes 18a and 18b each including one or more electrode fingers.

The electrode finger pitch of each IDT 17 and 18 is preferably set to $\lambda/2$ where $\lambda$ is the wavelength of the surface wave. Grating type reflectors 13 and 14 are preferably disposed at opposite ends of the IDTs 17 and 18, in the propagation direction of surface acoustic wave.

The second longitudinally coupled resonator filter 12 is preferably constructed in the same manner as the first longitudinally coupled resonator filter 11 except for the feature which will be described later. Thus, the second longitudinally coupled resonator filter 12 has an input IDT 19, an output IDT 20, and reflectors 15 and 16 wherein the IDT 19 has comb electrodes 19a and 19b each including one or more electrode fingers and the IDT 20 has comb electrodes 20a and 20b each including one or more electrode fingers.

In the surface acoustic wave resonator filter of preferred embodiments of the present invention, the first longitudinally coupled resonator filter 11 is connected in parallel to the second longitudinally coupled resonator filter 12. The method of connecting these longitudinally coupled resonator filters in parallel is described below with reference to FIG. 2.

Figure 2:
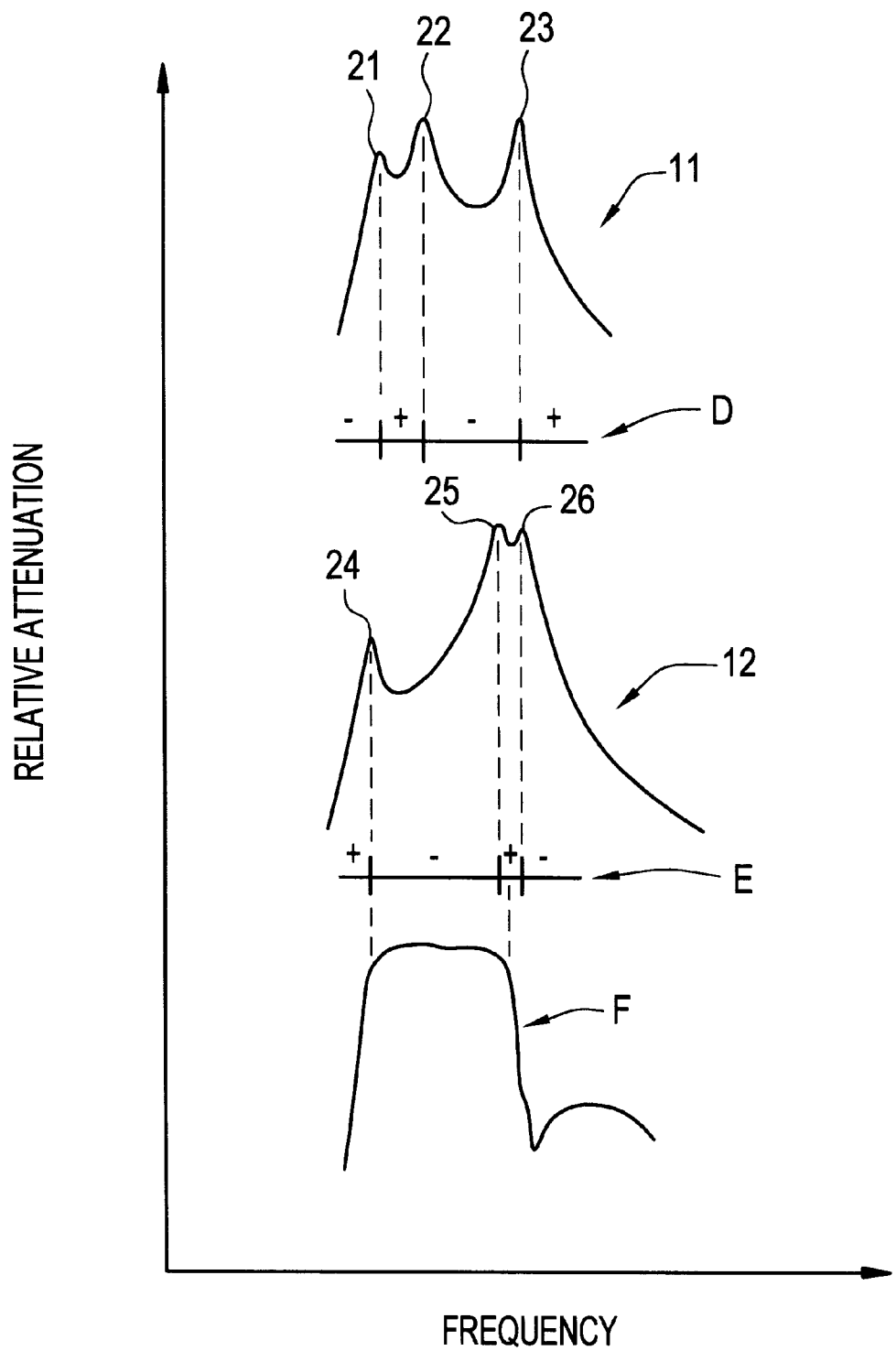
FIG. 2 is a graph illustrating the operation principle of the surface acoustic wave resonator filter shown in FIG. 1.

When a longitudinally coupled surface acoustic wave resonator filter is used as a bandpass filter, it is possible for the filter to have three resonance modes within or near the passband. As shown in FIG. 2, the first longitudinally coupled resonator filter 11 has three resonance modes 21–23 within or near the passband. As can be seen from FIG. 2, the first resonance mode 21, the second resonance mode 22, and the third resonance mode 23 occur at a lower frequency, a middle frequency, and a higher frequency, respectively.

Similarly, the second longitudinally coupled resonator filter 12 has first, second, and third resonance modes 24, 25 and 26 located within or near the passband wherein the first resonance mode 24, the second resonance mode 25, and the third resonance mode 26 occur at a lower frequency, a middle frequency, and a higher frequency, respectively.

In the surface acoustic wave resonator filter of the preferred embodiments of the present invention, the first and second longitudinally coupled resonator filters 11 and 12 are connected in parallel to each other in such a manner that the output of the first surface acoustic wave resonator filter for an input at frequencies higher than the resonance frequency of the third resonance mode 23 has a phase opposite to the phase of the output of the second surface acoustic wave resonator filter 12 for an input at frequencies higher than the resonance frequency of the third resonance mode 26. That is, of the IDTs 17–20, only the IDT 20 is arranged such that it has an electrode structure inverted in a vertical position relative to the other IDTs 17, 18 and 19.

Furthermore, the resonance modes 21–23 and 24–26 of the first and second longitudinally coupled resonator filters 11 and 12 are set as shown in FIG. 2. That is, the first resonance mode 21 of the longitudinally coupled resonator filter 11 is preferably set to have a resonance frequency nearly equal to the resonance frequency of the first resonance mode 24 of the second longitudinally coupled resonator filter 12.

Furthermore, the third resonance mode 23 of the first longitudinally coupled resonator filter 11, and the second and third resonance modes 25 and 26 of the second longitudinally coupled resonator filter 12 preferably have approximately equal resonance frequencies.

Furthermore, the resonance mode 23 of the first longitudinally coupled resonator filter 11 and the second and third resonance modes 25 and 26 of the second longitudinally coupled resonator filter 12 are set so that the resonance frequency of these resonance modes 23, 25, 26 increases in the order of the resonance modes 25, 23, and 26. That is, resonance frequency of the third resonance mode 23 of the first longitudinally coupled resonator filter 11 is greater than the resonance frequency of the second resonance mode 25 of the second longitudinally coupled resonator filter 12 and less than a resonance frequency of the third resonance mode 26 of the second longitudinally coupled resonator filter 12.

In the surface acoustic wave resonator filter shown in FIG. 1, since the resonance modes 21–23 and 24–26 of the first and second longitudinally coupled resonator filters are set in the above-described manner, and furthermore the first and second longitudinally coupled resonator filters are connected in parallel to each other in the above-described manner, the attenuation characteristic at the higher band edge is sharpened and a wider bandwidth can be achieved, as compared to conventional filters. Furthermore, a ripple in the passband is suppressed.

In the longitudinally coupled surface acoustic wave resonator filter according to preferred embodiments of the present invention, as described above, a phase inversion occurs at the resonance frequency of each resonance mode. The phase characteristics of the longitudinally coupled resonator filter 11 and 12 are shown along lines pointed to by arrows D and E, below the frequency characteristics in FIG. 2.

As described above, the first and second longitudinally coupled resonator filters 11 and 12 are connected to each other in such a manner that an output signal, at frequencies higher than the resonance frequency of the resonance mode 23, of the first longitudinally coupled resonator filter 11 has a phase which is opposite to the phase of the output signal, at frequencies higher than the resonance frequency of the resonance mode 26, of the second longitudinally coupled resonator filter 12. The phases in these frequency ranges are represented by symbols "+" and "−", respectively, and the phases in the other frequency ranges relative to the above phases are also represented by either "+" or "−".

As can be seen from FIG. 2, the first and second longitudinally coupled resonator filters 11 and 12 have the same phase characteristic in the frequency range from the resonance frequency of the second resonance mode 22 of the first longitudinally coupled resonator filter 11 to the resonance frequency of the second resonance mode 25 of the second longitudinally coupled resonator filter 12, and therefore no canceling occurs in this frequency range.

On the other hand, in the frequency range from the resonance frequency of the resonance mode 25 to the resonance frequency of the resonance mode 23, the first and second longitudinally coupled resonator filters 11 and 12 become opposite in phase to each other, and therefore the overall characteristic in this frequency range is defined by the difference in the output level between the two longitudinally coupled resonator filters 11 and 12. As a result, sharp attenuation occurs in this frequency range. Therefore, the surface acoustic wave resonator filter shown in FIG. 1 has a sharp attenuation characteristic at the higher edge of the Passband F, as shown at the bottom of FIG. 2.

In the frequency range from the resonance frequency of the resonance mode 21 or the resonance mode 24 to the resonance frequency of the resonance mode 22, the first and second longitudinally coupled resonator filters 11 and 12 are opposite in phase to each other. However, in this frequency range, the output level of the second longitudinally coupled resonator filter 12 is low relative to the output level of the first longitudinally coupled resonator filter 11, and thus the influence of the characteristic of the second longitudinally coupled resonator filter 12 on the output of the first longitudinally coupled resonator filter 11 is negligible and can be ignored.

However, in the vicinity of the resonance frequency of the resonance mode 24, since the output level of the second longitudinally coupled resonator filter 12 increases abruptly, the output level of the second longitudinally coupled resonator filter 12 cancels out the output of the first longitudinally coupled resonator filter 11. As a result, the overall attenuation increases abruptly near the resonance frequency of the resonance mode 24. Thus, the frequency range from the resonance frequency of the resonance mode 21 to the resonance frequency of the resonance mode 25 becomes the passband of the surface acoustic wave resonator filter of the present preferred embodiment.

In the frequency range lower than the resonance frequency of the resonance mode 21 and also in the frequency range higher than the resonance frequency of the resonance mode 26, the first and second longitudinally coupled resonator filters 11 and 12 become opposite in phase wherein the resonance frequency of the resonance mode 21 and the resonance frequency of the resonance mode 24 are close to each other and the resonance frequency of the resonance mode 23 and the resonance frequency of the resonance mode 26 are close to each other. As a result, in these frequency ranges, cancellation occurs between the outputs of the first and second longitudinally coupled resonator filters, and thus sharp attenuation is achieved at both the lower and higher band edges.

Furthermore, if the second resonance mode 25 and the third resonance mode 26 of the second longitudinally coupled resonator filters 11 and 12 are close in resonance frequency to each other as is the case in the second longitudinally coupled resonator filter 12, that is, if the difference in resonance frequency between the second resonance mode 25 and the third resonance mode 26 of the second longitudinally coupled resonator filter 12 is smaller than the difference in resonance frequency between the second resonance mode 22 and the third resonance mode 23 of the first longitudinally coupled resonator filter 11, then the second longitudinally coupled resonator filter 12 has a steeper attenuation characteristic at the higher band edge than the first longitudinally coupled resonator filter 11. In this case, if the third resonance mode 26 of the second longitudinally coupled resonator filter 12 is set to a resonance frequency slightly higher than that of the third resonance mode 23 of the first longitudinally coupled resonator filter 11, there a frequency point near the higher edge of the passband at which the output levels of the two resonator filters become absolutely equal to each other. As a result, an attenuation pole appears at that frequency point near the higher edge of the passband, and abrupt attenuation occurs near that frequency point.

Therefore, with the surface acoustic wave resonator filter shown in FIG. 1, it is possible to achieve a low insertion loss and wide-bandwidth bandpass filter having sharp attenuation at both the lower and higher edges of the band, as shown in FIG. 2.

Figure 3:
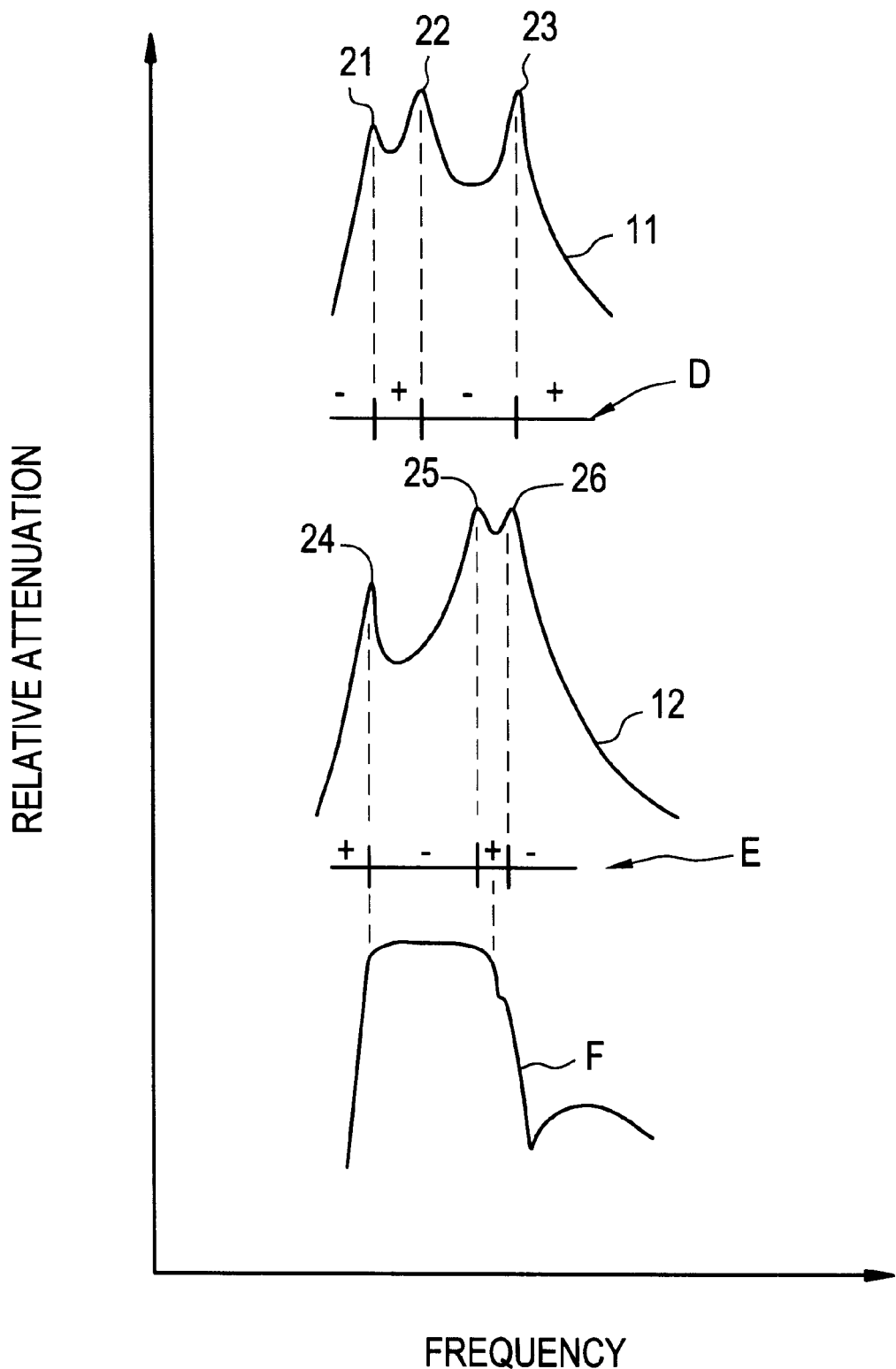
FIG. 3 is a graph illustrating an attenuation-frequency characteristic which will be obtained when the resonance mode 25 of the characteristic shown in FIG. 2 is slightly moved toward the center of the passband.

In this surface acoustic wave resonator filter, if the resonance frequency of the resonance mode 25 is moved slightly toward the center of the passband, the attenuation-frequency characteristic becomes as shown in FIG. 3. In this case, the first and second longitudinally coupled resonator filters 11 and 12 become opposite in phase to each other in the frequency range from the resonance frequency of the resonance mode 25 to the resonance frequency of the resonance mode 23. As a result, a ripple can occur within the passband and near the higher edge of the passband. To avoid such a ripple, it is desirable that the resonance frequency of the resonance mode 25 be as close as possible to the resonance frequency of the resonance mode 23. That is, it is desirable that the resonance frequency of the second resonance mode 25 of the second longitudinally coupled resonator filter 12 be as close as possible to the resonance frequency of the third resonance mode 23 of the first longitudinally coupled resonator filter 11.

If the first resonance mode 24 of the second longitudinally coupled resonator filter has a resonance frequency higher than the resonance frequency of the first resonance mode 21 of the first longitudinally coupled resonator filter, then a ripple can occur in the passband, near the lower edge of the passband. On the other hand, if the resonance frequency of the resonance mode 21 is higher than the resonance frequency of the resonance mode 24, the resonance modes 21 and 24 have the same phase in a certain range in the frequency range from the resonance frequency of the resonance mode 21 to the resonance frequency of the resonance mode 24. This causes a ripple and degradation in attenuation characteristic at the lower edge of the passband. For the above reason, it is desirable to set the resonance modes 21 and 24 so that they have a substantially equal resonance frequency.

Figure 4:
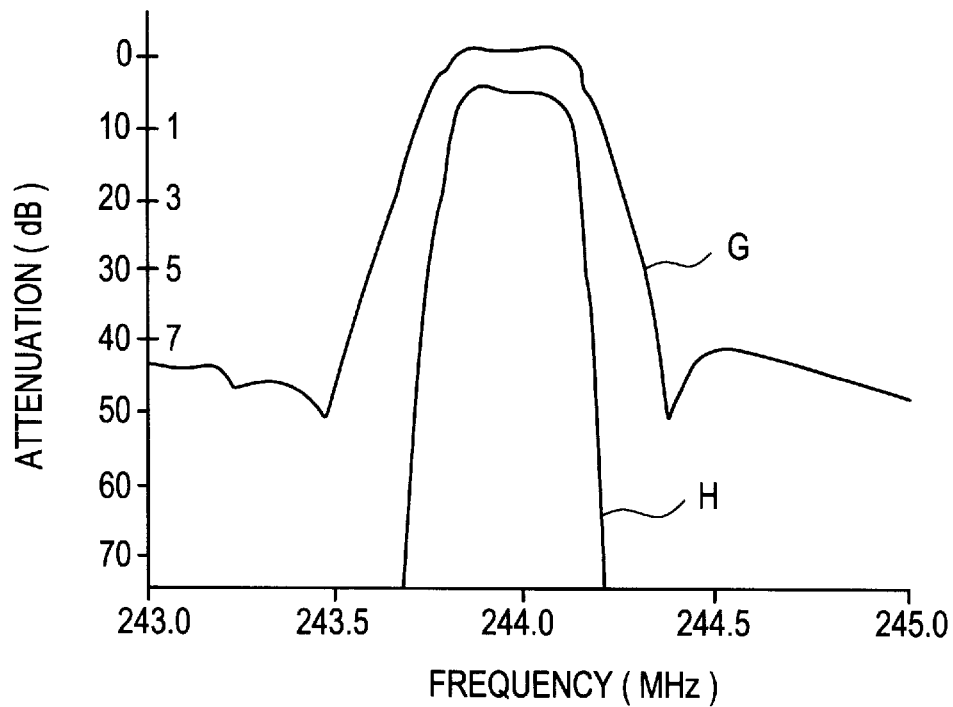
FIG. 4 is a graph illustrating the transmission characteristic of a surface acoustic wave resonator filter according to a preferred embodiment of the invention.

The surface acoustic wave resonator filter according to preferred embodiments of the present invention will be described in a more specific manner. In a specific preferred embodiment, the surface acoustic wave resonator filter shown in FIG. 1 is adapted to serve as an IF filter preferably having a center frequency of about 243.95 MHz for use in a PHS device. A quartz substrate is used as the piezoelectric substrate 10, and first and second longitudinally coupled resonator filters 11 and 12 are disposed on the quartz substrate in such a manner that they have resonance modes as shown in FIG. 2 and they are connected to each other in the above-described manner. FIG. 4 illustrates a specific example of the transmission characteristic as a function of frequency for the obtained surface acoustic wave resonator filter. In FIG. 4, the solid line H represents an enlarged attenuation characteristic of that represented by the solid line G wherein the attenuation for the solid line H is expressed in the scale on the right side of the vertical axis.

Figure 5:
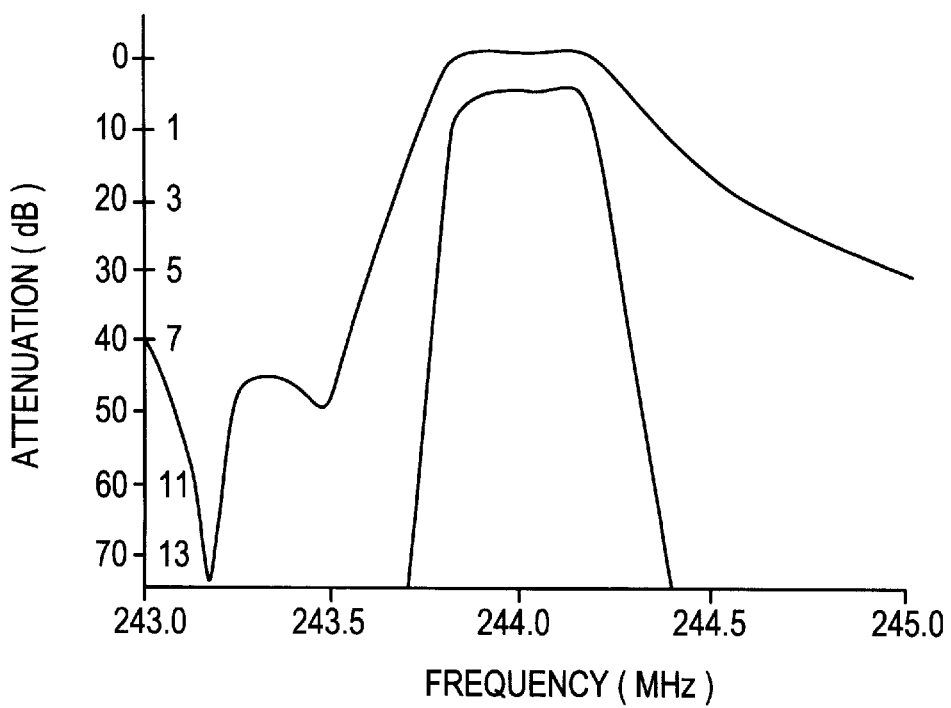
FIG. 5 is a graph illustrating a typical characteristic of a conventional surface acoustic wave resonator filter.
Figure 6:
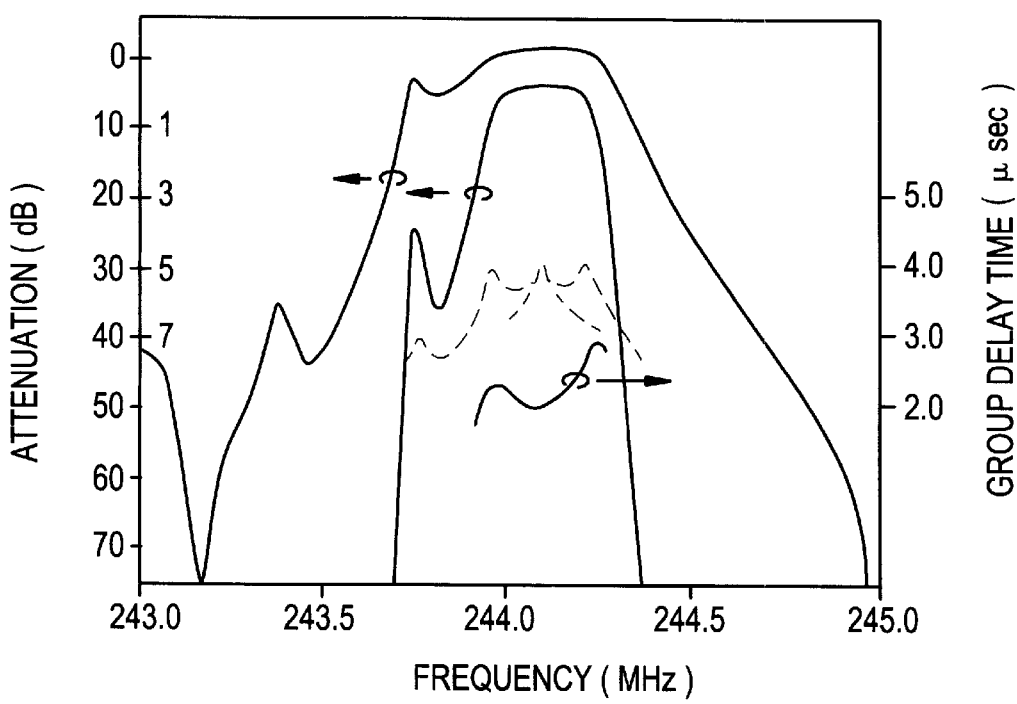
FIG. 6 is a graph illustrating a typical characteristic of a conventional surface acoustic wave resonator filter consisting of a plurality of surface acoustic wave resonator filters connected in parallel to each other.
Figure 7:
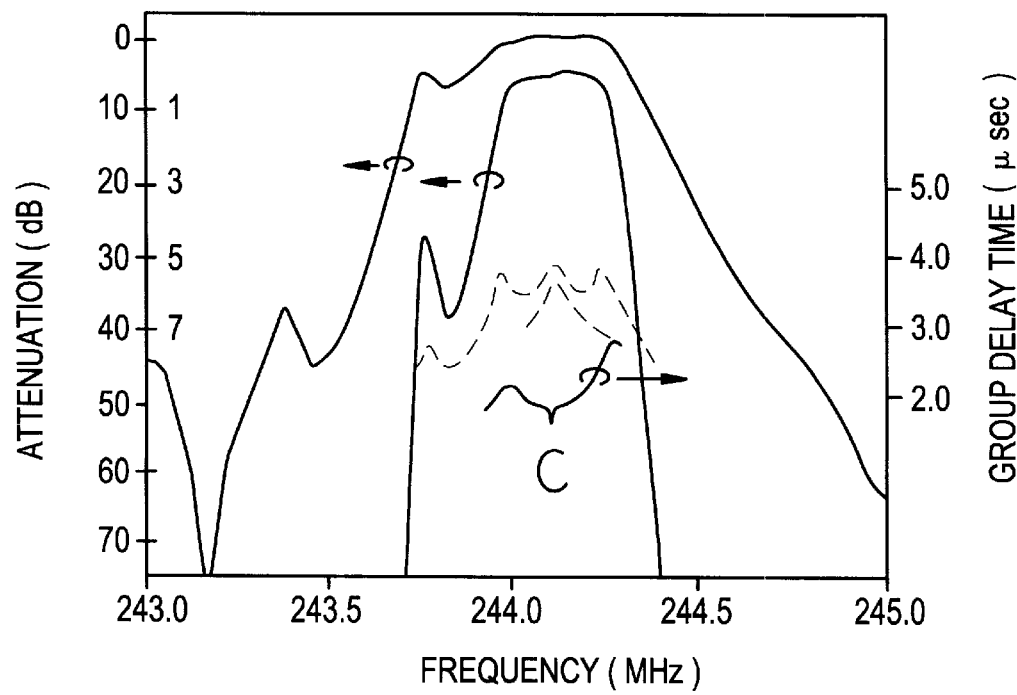
FIG. 7 is a graph illustrating a characteristic which will be obtained when the surface acoustic wave resonator filter shown in FIG. 6 is produced under processing conditions shifted from optimum conditions.

As can be seen from the comparison between the characteristic shown in FIG. 4 and the characteristics of the conventional longitudinally coupled surface acoustic wave resonator filters shown in FIGS. 5 and 6, the surface acoustic wave resonator filter of the present preferred embodiment has an attenuation pole near the higher edge of the passband and thus it has a sharper attenuation characteristic than the conventional surface acoustic wave resonator filters shown in FIGS. 5 and 6, although both the surface acoustic wave resonator filter of this preferred embodiment of the present invention and the conventional filter have similar characteristics within their passband.

In the surface acoustic wave resonator filter according to preferred embodiments of the present invention, as described above, the first and second longitudinally coupled resonator filters are connected in parallel to each other in such a manner that signals which are output, in response to the input signal, from the first and second longitudinally coupled resonator filters have opposite phases to each other at frequencies higher than the passband, and in such a manner that the three resonance modes of the first and second longitudinally coupled resonator filters have particular relationships among each other as described above, thereby achieving not only a low insertion loss and a wide bandwidth but also a sharper attenuation characteristic at edges of the passband. The unique resonance modes and novel combination of the three resonance modes may be achieved by properly selecting or adjusting the number of comb electrodes of each IDT, the distance between the reflectors and the corresponding comb electrodes, and the distance between the corresponding comb electrodes. The unique features of and advantages achieved by each of the three resonance modes according to preferred embodiments of the present invention were not known heretofore. However, the selecting and adjusting of comb electrodes and distances between reflectors and comb electrodes to achieve the desired novel resonance modes and novel combinations thereof are within the knowledge and capability of one of ordinary skill in the art.

Thus, the preferred embodiments of the present invention provide a bandpass filter having a low insertion loss, wide-bandwidth, and high selectivity. In particular, if the third resonance mode of the second longitudinally coupled resonator filter is set to have a sharper attenuation characteristic than the third resonance mode of the first longitudinally coupled resonator filter, and if the third resonance mode of the second longitudinally coupled resonator filter has a resonance frequency higher than the resonance frequency of the third resonance mode of the first longitudinally coupled resonator filter, then it is possible to achieve an extremely sharp attenuation characteristic at the higher edge of the passband.

Furthermore, if the difference in resonance frequency between the second and third resonance modes of the second longitudinally coupled resonator filter is smaller than the difference in resonance frequency between the second and third resonance modes of the first longitudinally coupled resonator filter, then the third resonance mode of the second longitudinally coupled resonator filter has a sharper characteristic which allows an attenuation pole to be located near the higher edge of the passband, which in turn allows the attenuation characteristic at the higher edge of the passband to become sharper.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A surface acoustic wave resonator filter comprising:
   first and second longitudinally coupled resonator filters connected in parallel to each other, each of said longitudinally coupled resonator filters including:
      a piezoelectric substrate;
      a plurality of interdigital transducers disposed on said piezoelectric substrate; and
      a pair of reflectors disposed at opposite sides of each of said interdigital transducers; wherein
   said first and second longitudinally coupled resonator filters each have first, second, and third resonance modes having a resonance frequency which increase in order of the first, second, and third resonance modes;
   said first and second longitudinally coupled resonator filters are connected in such a manner that output signals of said first and second longitudinally coupled resonator filters are opposite in phase to each other for an input signal having a frequency higher than a passband of the filter;
   the first resonance mode of said first longitudinally coupled resonator filter and the first resonance mode of said second longitudinally coupled resonator filter are close enough to each other so that a difference in resonance frequency between the first resonance mode of said first longitudinally coupled resonator filter and the first resonance mode of said second longitudinally coupled resonator filter is smaller than differences in resonance frequency between the first resonance mode and any other resonance modes for said first and second longitudinally coupled resonator filters; and
   the third resonance mode of said first longitudinally coupled resonator filter and the third resonance mode of said second longitudinally coupled resonator filter are close enough to each other so that a difference in resonance frequency between the third resonance mode of said first longitudinally coupled resonator filter and the third resonance mode of said second longitudinally coupled resonator filter is smaller than differences in resonance frequency between the third resonance mode and any other resonance modes for said first and second longitudinally coupled resonator filter.

2. A surface acoustic wave resonator filter according to claim 1, wherein the third resonance mode of said second longitudinally coupled resonator filter has a steeper characteristic than the third resonance mode of said first longitudinally coupled resonator filter, and the third resonance mode of said second longitudinally coupled resonator filter is located at a higher frequency than the third resonance mode of said first longitudinally coupled resonator filter.

3. A surface acoustic wave resonator filter according to claim 1, wherein a difference in resonance frequency between the second and third resonance modes of said second longitudinally coupled resonator filter is smaller than a difference in resonance frequency between the second and third resonance modes of said first longitudinally coupled resonator filter.

4. A surface acoustic wave resonator filter according to claim 1, wherein the first resonance mode of said first longitudinally coupled resonator filter and the first resonance mode of said second longitudinally coupled resonator filter are substantially equal to each other.

5. A surface acoustic wave resonator filter according to claim 1, wherein the resonance frequency of the third resonance mode of the first longitudinally coupled resonator filter is greater than the resonance frequency of the second resonance mode of the second longitudinally coupled resonator filter and is less than the resonance frequency of the third resonance mode of the second longitudinally coupled resonator filter.

6. A surface acoustic wave resonator filter according to claim 1, wherein output signals of said first and second longitudinally coupled resonator filters are opposite in phase to each other for an input signal having a frequency in range extending from below the resonance frequency of the second resonance mode of the second longitudinally coupled resonator filter to the resonance frequency of the third resonance mode of the first longitudinally coupled resonator filter.

7. A surface acoustic wave resonator filter according to claim 1, wherein output signals of said first and second longitudinally coupled resonator filters are opposite in phase to each other for an input signal having a frequency lower than the resonance frequency of the first resonance mode of the first longitudinally coupled resonator filter and having a frequency above the resonance frequency of the third resonance mode of the second longitudinally coupled resonator filter.

8. A surface acoustic wave resonator filter comprising:
   first and second longitudinally coupled resonator filters connected in parallel to each other, each of said longitudinally coupled resonator filters including:
      a piezoelectric substrate;
      a plurality of interdigital transducers disposed on said piezoelectric substrate; and
      a pair of reflectors disposed at opposite sides of each of said interdigital transducers; wherein
   said first and second longitudinally coupled resonator filters each have first, second and third resonance modes having a resonance frequency which increases in order of the first, second, and third resonance modes and said first and second longitudinally coupled resonator filters are connected in such a manner that output signals of said first and second longitudinally coupled resonator filters are opposite in phase to each other for an input signal having a frequency higher than a passband of the filter and wherein a difference in resonance frequency between the third resonance mode of said first longitudinally coupled resonator filter and the third resonance mode of said second longitudinally coupled resonator filter is smaller than differences in resonance frequency between the third resonance mode and any other resonance modes for said first and second longitudinally coupled resonator filters.

9. A surface acoustic wave resonator filter comprising:
   first and second longitudinally coupled resonator filters connected in parallel to each other, each of said longitudinally coupled resonator filters including:
      a piezoelectric substrate;
      a plurality of interdigital transducers disposed on said piezoelectric substrate; and
      a pair of reflectors disposed at opposite sides of each of said interdigital transducers; wherein
   said first and second longitudinally coupled resonator filters each have first, second, and third resonance modes having a resonance frequency which increases in order of the first, second, and third resonance modes and a difference in resonance frequency between the third resonance mode of said first longitudinally coupled resonator filter and the third resonance mode of said second longitudinally coupled resonator filter is smaller than differences in resonance frequency between the third resonance mode and any other resonance modes for said first and second longitudinally coupled resonator filters and the first resonance mode of said first longitudinally coupled resonator filter and the first resonance mode of said second longitudinally coupled resonator filter are close enough to each other so that a difference in resonance frequency between the first resonance mode of said first longitudinally coupled resonator filter and the first resonance mode of said second longitudinally coupled resonator filter is smaller than differences in resonance frequency between the first resonance mode and any other resonance modes for said first and second longitudinally coupled resonator filters.

10. A surface acoustic wave resonator filter comprising:

first and second longitudinally coupled resonator filters connected in parallel to each other, each of said longitudinally coupled resonator filters including:
a piezoelectric substrate;
a plurality of interdigital transducers disposed on said piezoelectric substrate; and
a pair of reflectors disposed at opposite sides of each of said interdigital transducers; wherein said first and second longitudinally coupled resonator filters each have first, second, and third resonance modes having a resonance frequency which increase in order of the first, second, and third resonance modes and the third resonance mode of said first longitudinally coupled resonator filter and the third resonance mode of said second longitudinally coupled resonator filter are close enough to each other so that a difference in resonance frequency between the third resonance mode of said first longitudinally coupled resonator filter and the third resonance mode of said second longitudinally coupled resonator filter is smaller than differences in resonance frequency between the third resonance mode and any other resonance modes for said first and second longitudinally coupled resonator filter.

11. A surface acoustic wave resonator filter comprising:

first and second longitudinally coupled resonator filters connected in parallel to each other, each of said longitudinally coupled resonator filters including:
a piezoelectric substrate;
a plurality of interdigital transducers disposed on said piezoelectric substrate; and
a pair of reflectors disposed at opposite sides of each of said interdigital transducers; wherein said first and second longitudinally coupled resonator filters each have first, second, and third resonance modes having a resonance frequency which increases in order of the first, second, and third resonance modes, a difference in resonance frequency between the third resonance mode of said first longitudinally coupled resonator filter and the third resonance mode of said second longitudinally coupled resonator filter is smaller than differences in resonance frequency between the third resonance mode and any other resonance modes for said first and second longitudinally coupled resonator filters, and one of the plurality of interdigital transducers is arranged to be inverted relative to the others of the plurality of interdigital transducers.

* * * * *